(12) United States Patent
Vajaria et al.

(10) Patent No.: US 10,290,088 B2
(45) Date of Patent: May 14, 2019

(54) WAFER AND LOT BASED HIERARCHICAL METHOD COMBINING CUSTOMIZED METRICS WITH A GLOBAL CLASSIFICATION METHODOLOGY TO MONITOR PROCESS TOOL CONDITION AT EXTREMELY HIGH THROUGHPUT

(71) Applicant: KLA-Tencor Corporation, Milpitas, CA (US)

(72) Inventors: Himanshu Vajaria, San Jose, CA (US); Tommaso Torelli, San Mateo, CA (US); Bradley Ries, San Jose, CA (US); Mohan Mahadevan, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 560 days.

(21) Appl. No.: 14/209,198

(22) Filed: Mar. 13, 2014

(65) Prior Publication Data
US 2015/0234379 A1    Aug. 20, 2015

Related U.S. Application Data

(60) Provisional application No. 61/939,739, filed on Feb. 14, 2014.

(51) Int. Cl.
*G06T 7/00* (2017.01)
*H01L 21/66* (2006.01)

(52) U.S. Cl.
CPC .......... *G06T 7/0004* (2013.01); *H01L 22/12* (2013.01); *H01L 22/20* (2013.01);
(Continued)

(58) Field of Classification Search
USPC ........................................ 700/121
See application file for complete search history.

(56) References Cited

U.S. PATENT DOCUMENTS

| | | | |
|---|---|---|---|
| 6,459,949 B1 * | 10/2002 | Black | G05B 19/41875 700/104 |
| 2001/0000460 A1 * | 4/2001 | Ishihara | G01N 21/88 382/149 |

(Continued)

FOREIGN PATENT DOCUMENTS

| | | |
|---|---|---|
| CN | 103137513 A | 6/2013 |
| JP | H08250569 A | 9/1996 |

(Continued)

OTHER PUBLICATIONS

Hess et al., "Extraction of Wafer-Level Defect Density Distributions to Improve Yield Prediction", May 1999, IEEE Transactions on Semiconductor Manufacutring, vol. 12 No. 2, pp. 175-183.*

(Continued)

*Primary Examiner* — Jason Lin
(74) *Attorney, Agent, or Firm* — Suiter Swantz pc llo

(57) ABSTRACT

Methods and systems for monitoring process tool conditions are disclosed. The method combines single wafer, multiple wafers within a single lot and multiple lot information together statistically as input to a custom classification engine that can consume single or multiple scan, channel, wafer and lot to determine process tool status.

19 Claims, 5 Drawing Sheets

(52) U.S. Cl.
CPC ............... *G06T 2207/20076* (2013.01); *G06T 2207/30148* (2013.01); *Y02P 90/14* (2015.11)

(56) References Cited

U.S. PATENT DOCUMENTS

| | | | | |
|---|---|---|---|---|
| 2001/0016363 | A1* | 8/2001 | Yano | H01L 22/26 438/9 |
| 2002/0161532 | A1* | 10/2002 | Dor | H01L 22/20 702/35 |
| 2003/0208286 | A1* | 11/2003 | Abercrombie | G06Q 10/043 700/31 |
| 2004/0040003 | A1* | 2/2004 | Seligson | G03F 7/705 382/151 |
| 2005/0256601 | A1 | 11/2005 | Lee et al. | |
| 2008/0013083 | A1* | 1/2008 | Kirk | G01N 21/4738 356/237.5 |
| 2009/0136117 | A1* | 5/2009 | Barkol | G01N 21/93 382/145 |
| 2009/0240366 | A1* | 9/2009 | Kaushal | G05B 13/0265 700/110 |
| 2011/0038527 | A1* | 2/2011 | Liu | G06K 9/6203 382/145 |
| 2011/0202298 | A1 | 8/2011 | Izikson et al. | |
| 2011/0276935 | A1 | 11/2011 | Fouquet et al. | |
| 2012/0327212 | A1* | 12/2012 | Kitahashi | H01J 37/28 348/80 |
| 2013/0144419 | A1* | 6/2013 | Tsai | H01L 22/20 700/108 |
| 2013/0150997 | A1* | 6/2013 | Tsai | C23C 16/52 700/121 |

FOREIGN PATENT DOCUMENTS

| | | |
|---|---|---|
| KR | 10-1017109 B1 | 2/2011 |
| WO | 2002027782 A1 | 4/2002 |

OTHER PUBLICATIONS

Office Action dated Sep. 5, 2018 for Chinese Patent Application No. 201580008339.9.

Office Action dated Jan. 8, 2019 for JP Patent Application No. 2016-551779.

* cited by examiner

WAFER AND LOT BASED HIERARCHICAL METHOD COMBINING CUSTOMIZED METRICS WITH A GLOBAL CLASSIFICATION METHODOLOGY TO MONITOR PROCESS TOOL CONDITION AT EXTREMELY HIGH THROUGHPUT

CROSS-REFERENCE TO RELATED APPLICATIONS

The present application claims the benefit under 35 U.S.C. § 119(e) of U.S. Provisional Application Ser. No. 61/939,739, filed Feb. 14, 2014. Said U.S. Provisional Application Ser. No. 61/939,739 is hereby incorporated by reference in its entirety.

TECHNICAL FIELD

The disclosure generally relates to the field of semiconductor device manufacturing, particularly to methods for monitoring process tool conditions.

BACKGROUND

Thin polished plates such as silicon wafers and the like are a very important part of modern technology. A wafer, for instance, refers to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well.

SUMMARY

The present disclosure is directed to a method for monitoring a process tool condition. The method includes: obtaining a plurality of wafer images of a plurality of wafers, the plurality of wafers including wafers fabricated in a plurality of wafer lots; calculating one or more wafer-level metrics for each particular wafer of the plurality of wafers, the wafer-level metrics for each particular wafer being calculated based on the wafer image obtained for that particular wafer; calculating a lot-level statistical value for each particular wafer lot of the plurality of wafer lots, the lot-level statistical value for each particular wafer lot being calculated at least partially based on: wafer-level metrics for wafers fabricated in that particular wafer lot and wafer-level metrics for wafers fabricated in at least one additional wafer lot in a specified process group; and performing a statistical analysis of the process tool based on the wafer-level metrics or the lot-level statistical values.

A further embodiment of the present disclosure is directed to a process tool condition monitoring system. The system includes an imaging device and a processor. The imaging device is configured to obtain a plurality of wafer images of a plurality of wafers, wherein the plurality of wafers includes wafers fabricated in a plurality of wafer lots. The processor is configured to calculate one or more wafer-level metrics for each particular wafer of the plurality of wafers, wherein the wafer-level metrics for each particular wafer is calculated based on the wafer image obtained for that particular wafer. The processor is also configured to calculate a lot-level statistical value for each particular wafer lot of the plurality of wafer lots, wherein the lot-level statistical value for each particular wafer lot is calculated at least partially based on: wafer-level metrics for wafers fabricated in that particular wafer lot and wafer-level metrics for wafers fabricated in at least one additional wafer lot in a specified process group. The processor then identifies a potential process tool drift condition based on the wafer-level metrics or the lot-level statistical values.

An additional embodiment of the present disclosure is directed to a method for monitoring a process tool condition. The method includes: obtaining a plurality of full wafer images of a plurality of wafers, the plurality of wafers including wafers fabricated in a plurality of wafer lots; calculating one or more wafer-level metrics for each particular wafer of the plurality of wafers, the wafer-level metrics for each particular wafer being calculated based on the full wafer image obtained for that particular wafer; calculating a lot-level statistical value for each particular wafer lot of the plurality of wafer lots, the lot-level statistical value for each particular wafer lot being calculated at least partially based on: wafer-level metrics for wafers fabricated in that particular wafer lot and wafer-level metrics for wafers fabricated in at least one additional wafer lot in a specified process group; identifying a potential process tool drift condition based on the wafer-level metrics or the lot-level statistical values; receiving a user adjustment regarding the identified potential process tool drift condition; and adjusting a process utilized to identify the potential process tool drift condition based on the user adjustment.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Fabrication of semiconductor devices involves highly complex process flows with multiple process tool sets. The process tools may include photolithography tools, etch tools, deposition tools, polishing tools, thermal processing tools, implantation tools and the like. Wafers or wafer lots (a wafer lot, or a lot, is defined as a quantity of wafers which are processed together as a single group) are processed in such tools in a predetermined order. Maintaining high precision during semiconductor fabrication processes is of critical importance.

The precision of these process tools degrades over time due to a phenomenon known as tool drift. Conventional techniques used to handle process tool drift include using a learning method where the process engineer figures out empirically how long before the process tool needs preventive maintenance or a monitoring system which can find problems only after degradation has occurred. These conventional techniques generally result in loss of wafers and materials because either the operator will notice tool drift after multiple wafer lots have already been damaged (wafer loss) or conversely be too aggressive in performing process tool preventive maintenance, thus unnecessarily replacing parts (material loss).

In addition, conventional techniques provide no early detection of process tool issues. Such techniques can only detect issues once a problem has occurred and created defects that can only then be captured. In light of the speed of the fabrication system, the wafer sampling rate is very low, the detection technique as such is not practical and creates a large overhead especially for process tools that have a one- to two-day preventive maintenance cycle. Such detection techniques may also cause lost wafers and materials, and therefore reduce yield. This is especially critical for foundries where they may only have a few lots per device to manufacture.

The present disclosure is directed to methods and devices for providing a robust early warning system at high throughput to flag process tool drift in a semiconductor production flow. The methods and devices in accordance with the present disclosure also reduce wafer and material loss caused by process tool drift. More specifically, the methods and devices in accordance with the present disclosure use new algorithms to combine single wafer, single lot and multiple lot information together statistically as input to a custom classification engine that can consume single or multiple scan, channel, wafer and lot to determine process tool status.

Figure 1:
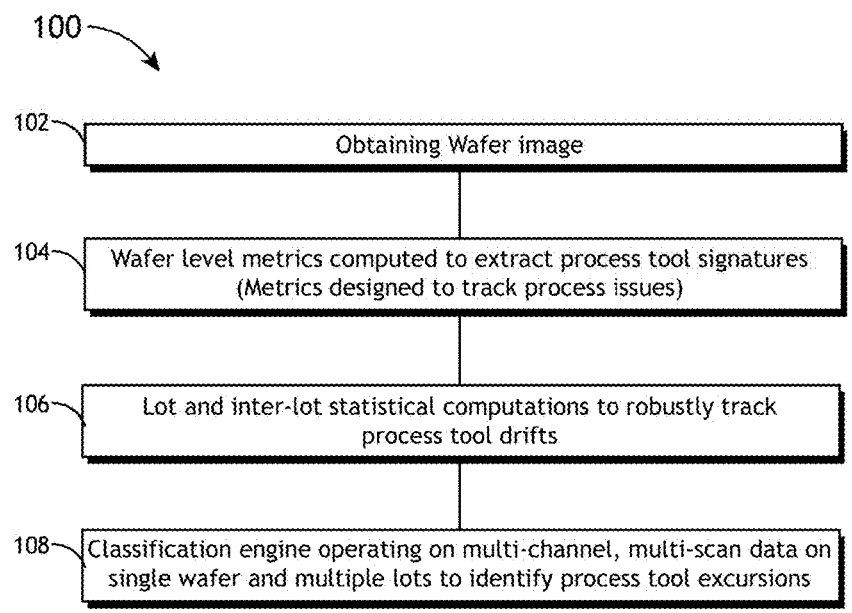
FIG. 1 is a flow diagram illustrating a method for monitoring a process tool condition.

Referring to FIG. 1, a flow diagram depicting a method 100 for monitoring a process tool condition is shown. It is noted that this method determines process tool drifts without detecting specific wafer defects. Rather, the method computes broad wafer-based and lot-based metrics and feeds these broad metrics into a classification engine to identify and extract process tool drifts. This technique allows the method in accordance with the present disclosure to be robust and therefore capable of providing early detection. Furthermore, this technique is operable under simpler optical modes (i.e., low optical resolution requirements) thereby enabling a high throughput.

As depicted in FIG. 1, wafer images are obtained in step 102. In one embodiment, images of entire/full wafers are obtained, which may be the front side, back side or edge surface of the wafers or a combination thereof. However, it is contemplated that partial wafer images may also be utilized without departing from the spirit and scope of the present disclosure. For instance, in certain embodiments, this process can be broken up into smaller wafer sections and the sections can be processed in parallel, e.g., in a distributed computing architecture. Alternatively, one or more specific regions of the wafers may be of particular interest, and images of such specific regions may be obtained for analysis purposes. It is contemplated that these wafer regions may be defined in various different manners, for example, they may be defined as sectors, slices, polygons, rings, ovals or any other geometric shapes.

It is also contemplated that the wafer images obtained are not required to be high resolution images. Instead, it may be preferable in certain embodiments to utilize lower resolution images to reduce the amount of resources needed (e.g., memory space, computation power and the like) to process them. In certain embodiments, if high resolution images are obtained, a down-sampling process may be carried out to lower the resolution to a preferred level. It is contemplated that using images down-sampled from high resolution images in accordance with certain embodiments of the present disclosure allows the wafer images to be obtained in real time and simultaneously with a high-resolution microscopic defect detection process, without impact to the wafer scanning time. It is understood that the resolution of the wafer images can be tuned by the user to a varying degree of detail according to the challenge at hand, anywhere from the scan resolution to a few millimeters range.

Once the wafer images are obtained, various wafer-level metrics can then be computed in step 104 based on the images. These wafer-level metrics are designed to extract process tool signatures and identify non-uniformities among various wafers, which may in turn indicate potential issues the process tool may be experiencing. More specifically, these wafer-level metrics are designed to quantify and track manufacturing process conditions over a long period of time, and they are able to measure unique signatures caused by process tools (e.g., polishing/planarization, etch, litho, photo, implant, or the like), whether the signatures were caused by normal processes or out-of-control processes.

Certain embodiments in accordance with the present disclosure utilize a variety of sources to calculate the wafer-level metrics. The variables utilized for calculating the wafer-level metrics may include, but are not limited to: illumination source type, intensity and wavelength, illumination and collection optical geometries, variable optical apertures of various shapes, light polarization or the like. In addition, the wafer-level metrics are also computed from a variety of image processing sources. For example, the input images used for this calculation may include the wafer pattern, or alternatively, the pattern may be subtracted out. The input images may also be produced through a variety of image fusion techniques from multiple scan images obtained under different system conditions (illumination, collection, processing). Furthermore, according to specific user/processing needs, a variety of image filtering techniques may be applied throughout the image processing phase.

It is contemplated that the type of metrics produced will be inherently tied to the optical signal response of the wafer under the optical conditions as imaged by the system. In certain embodiments, the computation processes carried out in step 104 are designed to extract a variety of metrics directly derived from the pixel intensity of the various image components, a variety of spatial metrics encapsulating information about possible wafer signatures and several frequency space metrics that look at variable frequency ranges and all of amplitude, phase and energy information contents. It is also contemplated that additional metrics may be computed and utilized without departing from the spirit and scope of the present disclosure, and that the specific types of metrics to be produced are configurable and customizable by the user utilizing the method in accordance with the present disclosure.

Figure 2:
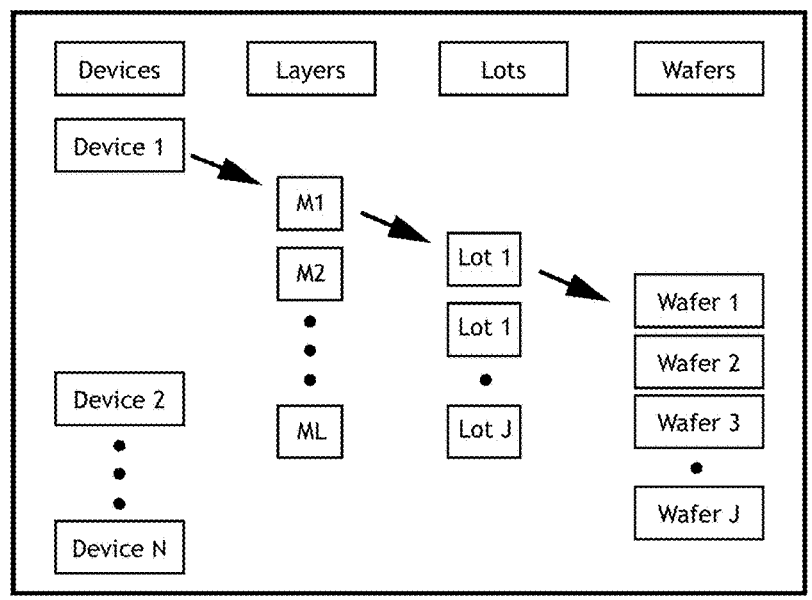
FIG. 2 is an illustration depicting a hierarchical relationship between devices, layers, lots and wafers.

The calculated wafer-level metrics are then fed into a statistical computation module in step 106 to perform statistical analysis. In accordance with the present disclosure, the statistical computation module takes into consideration single wafer, multiple wafers within a single lot, as well as multiple lot information together to establish what should be considered statistically normal for classification purposes. FIG. 2 is an illustration that helps describing this statistical computation process in more detail.

In typical fabrication operations, the semiconductor manufacturing process is subdivided into a variety of technology nodes, devices and layers. Each distinct node/device/layer triplet by default defines what is referred to as a "process group". Wafers for each node/device/layer combination are run in batches called lots (composed of a plurality of wafers, e.g., typically 25 wafers). In other words, as shown in FIG. 2, a device (e.g., a processor, a memory, a camera or any other sensor, an automotive chip, a MEMS, a circuit chip or the like) may include one or more layers; for each layer one or more wafer lots may be processed; and each wafer lot may include multiple wafers processed together. A process engineer (i.e., a user) interested in studying the behavior of a particular process tool may have the knowledge regarding which process components were handled by that particular tool, and may therefore establish an inspection sampling strategy in which an optimal subset of wafers from each lot is selected for statistical analysis. For example, layers $M_i$, $M_j$, and $M_k$ (from the same or different technology nodes and devices) may include wafers (or wafer lots) that the engineer wants to analyze as a group. The ability to provide joint analysis, i.e., taking multiple lot and inter-lot (i.e., a mixture of wafer lots) metrics to make a joint decision, makes the statistical computations in accordance with the present disclosure more robust and less burdensome to the user.

It is noted that step 106 is carried out based on data received from step 104, and an initial training phase is needed to establish a baseline for each process group. In certain embodiments, data from a minimum number of wafers and lots for each process group (i.e., combination of devices and layers) need to be collected in order to have adequate statistics for training the system. For instance, the initial recommendation is to train the system using a minimum of 50 wafers from 10 different lots for each process group. It is understood, however, that this number is configurable and may vary without departing from the spirit and scope of the present disclosure. Typically, more training wafers provide more robust statistical models.

Once an adequate baseline has been established for a user-specified process group, normalized metrics are computed for each raw metric. This allows all metrics to span similar scales and more importantly the normalized values have a direct meaning in terms of probability of the event. In one embodiment, normalized metrics for wafers belonging to the same lot are processed jointly to obtain one or more lot-level metrics, and both wafer-level and/or lot-level metrics may then be utilized for analysis and classification purposes. More specifically, the multiple lot and inter-lot metrics are jointly computed at the lot-level. For instance, the normalized statistical value for a particular lot may be calculated as:

$$NormRg_{lot} = <\frac{x_i - \mu_{PG}}{\sigma_{PG}}>_{\{i \in Lot\}}$$

Where $x_i$ denotes the raw metrics received for the $i^{th}$ wafer in the lot, $\mu_{PG}$ denotes the calculated mean, and $\sigma_{PG}$ denotes the calculated standard deviation of the population within the same process group. It is noted that the process group refers to the analysis group specified by the user as previously described. In reference to the example illustrated above, the process group includes layers $M_i$, $M_j$, and $M_k$.

It is contemplated that this normalized, lot-level computation may be performed independently for each type of raw metrics received from step 104. In this manner, for each type of raw metrics calculated in step 104, the statistical computation step 106 will produce a normalized value for each lot in the process group. Likewise, derived and consolidated attributes can be computed under a variety of aggregation schemes. For example, some of the derived attributes may take into consideration the maximum, minimum, mean, standard deviation, bandwidth as well as other statistical data of all the metrics or subgroups thereof. In another example, some of the consolidated attributes may take into consideration the norm, sum, sum-of-squares as well as other statistical data of all the metrics or subgroups thereof. In addition, a mixture of consolidation and derivation across different metrics may be computed. Furthermore, weighted voting schemes can be utilized to further arbitrate and consolidate the computed data to a single global attribute.

It is also contemplated that the statistical computation module as described above may incorporate a temporal component into the analysis. For instance, the normalized metrics can be analyzed over a certain period of time to monitor process tool health, for example, as a trigger mechanism to determine when preventive or corrective maintenance is required on a specific process tool. The established baseline can be periodically updated to reflect a slow, expected drift in the manufacturing process conditions, and past baselines can be revisited to obtain an accurate historical record of the average behavior of the fabrication process over time.

Now, once the statistical computations are completed in step 106, the results are provided to a classification engine in step 108 to identify any potential issues. It is contemplated that the classification engine may take several approaches to facilitate the classification process. In one embodiment, an unsupervised approach is taken where the classification engine calculates a statistical normal value for a given type of measurement metrics based on the normalized values received from step 106. In this unsupervised mode of operation, the classification engine simply ranks each wafer and lot according to how far it deviates from the trained baseline. The user may set a threshold for what is considered an outlier based on one or more wafer- or lot-level metrics, as well as any of the derived, consolidated or global attributes. The classification engine may then identify and report the outliers, if any, based on this threshold value. This approach is referred to as the unsupervised approach because no supervision or detailed classification input is required from the user.

Alternatively and/or additionally, a supervised approach may be utilized where the user may review the identified outliers determined by the classification engine and respond to the system as to whether such identified outliers are confirmed excursions or not. In this manner, user input can be used to train the classification engine, and it is understood that various types of machine learning techniques may be utilized to facilitate this training process without departing from the spirit and scope of the present disclosure.

For instance, in one embodiment, the classification engine requires a certain number of wafers and/or lots to be manually classified by the user as one or more categories of interest. This information is passed to the classification engine and a statistical model of each classified process group is generated. Subsequently, each wafer will be classified by the engine according to one of the categories with an associated confidence level. The user may be provided with various options: a) accept the default classification results of the supervised classification engine; b) set a threshold on the confidence level to further discriminate between outcomes; or c) reject the answer and retrain the engine to incorporate the rejection as a way of improving the performance of the classification engine.

Figure 3:
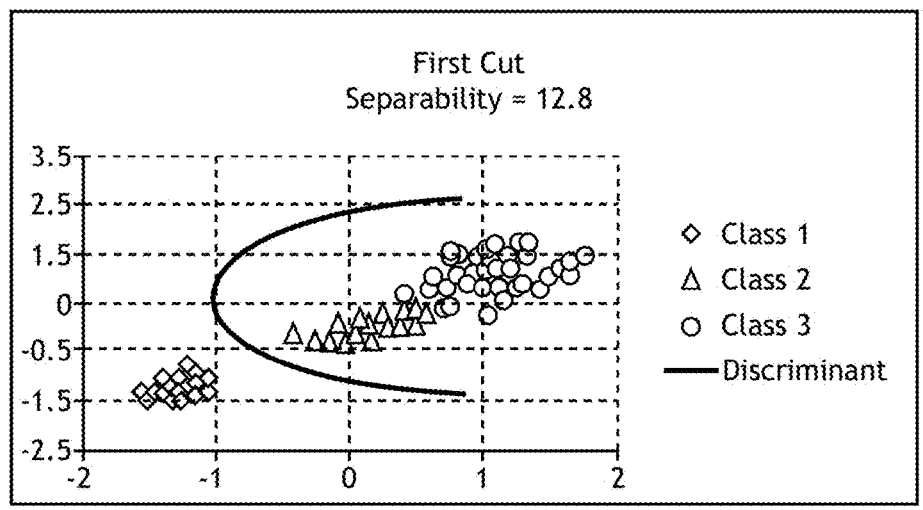
FIG. 3 is an illustration depicting classification analysis using a first discriminant.
Figure 4:
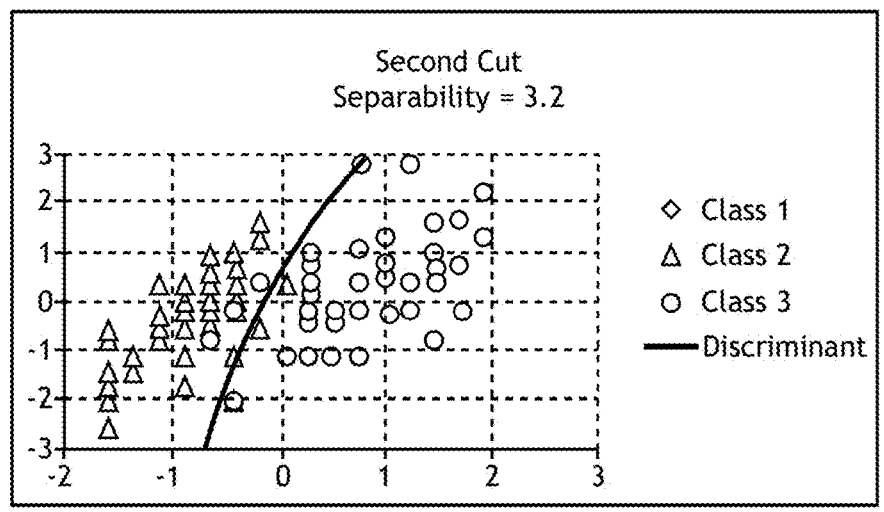
FIG. 4 is an illustration depicting classification analysis using a second discriminant.

It is contemplated that the user may choose whether to let the classification engine operate in the unsupervised or supervised mode. The advantages of the unsupervised mode include the ease of use, in that little to no user input is required. In addition, it enables trending use case, in which the key aspect is not focused on the classification of particular events, but the identification of drifts in the process data in a potentially harmful direction. This ability allows the user to take notice of the trend before undesirable events actually occur. The supervised mode, on the other hand, provides several advantages as well. For instance, it is capable of discriminating between two or more wafer categories. It is also able to process data in a highly dimensional space and automatically determine the optimal discriminant hyper-surfaces to separate the different categories. These abilities are illustrated in FIGS. 3 and 4, where different discriminants are analyzed and the discriminant providing the optimal separability can be identified and used for classification purposes.

It is also contemplated that the user may choose to have full control in determining which metrics participate into the classification mechanism. Alternatively and/or additionally, the system may automatically choose from the various metrics for classification purposes based on performance.

It is understood that the classification engine may utilize various machine learning and classification techniques without departing from the spirit and scope of the present disclosure. In certain embodiments, the classification techniques utilize processes including, but not limited to: analysis of statistical correlation and linear independence of the metrics to pare down the metric population to the smallest set containing most of the useful information for classification; multiple schemes for ranking the metrics based on their ability to separate the classes; final selection of metrics through information theory, based upon the classified population size; cluster analysis in the remaining metric dimensions, where non-linear cuts between populations of different classes can be drawn and custom class weights can be applied to fine tune how heavily the cuts lean towards each class over all others; and analysis of the classified population to determine redundancy and thus considerably cut down on the computation time without loss to the classification quality. Furthermore, it is contemplated that the supervised mode can also be used in a recursive manner to mine for more examples of bad wafers and to further refine its own performance via user corrections.

It is also contemplated that the unsupervised and supervised modes can be used in synergy. For instance, the unsupervised mode may be initially used to highlight outlier wafers, which become possible candidates to feed as multiple classified wafer categories required by the supervised classification engine. In another example, the two modes may be used in conjunction based on their responses to different features. More specifically, the unsupervised mode is unbiased in terms of features; the supervised engine, on the other hand, will tune to features that distinguish between the given wafer categories. Now if there is a new kind of process variation, not captured by the trained categories and affecting other features, the feature-biased supervised engine might entirely miss it. For such cases, assuming the user realized that this new type has surfaced, the user would have to retrain the supervised engine to capture this new category. Conversely, the unsupervised approach, as a general indicator of statistical anomaly, most likely will have flagged this new event as an outlier.

In certain embodiments, multiple instances of unsupervised and/or supervised classifiers may run simultaneously, each being specifically tuned to identify different kinds of outliers, as opposed to running a single classifier to encompass multiple different signatures which could achieve worse classification performance. It is contemplated that whether to utilize multiple classifiers, and the specific number of such classifiers, may vary without departing from the spirit and scope of the present disclosure.

Figure 5:
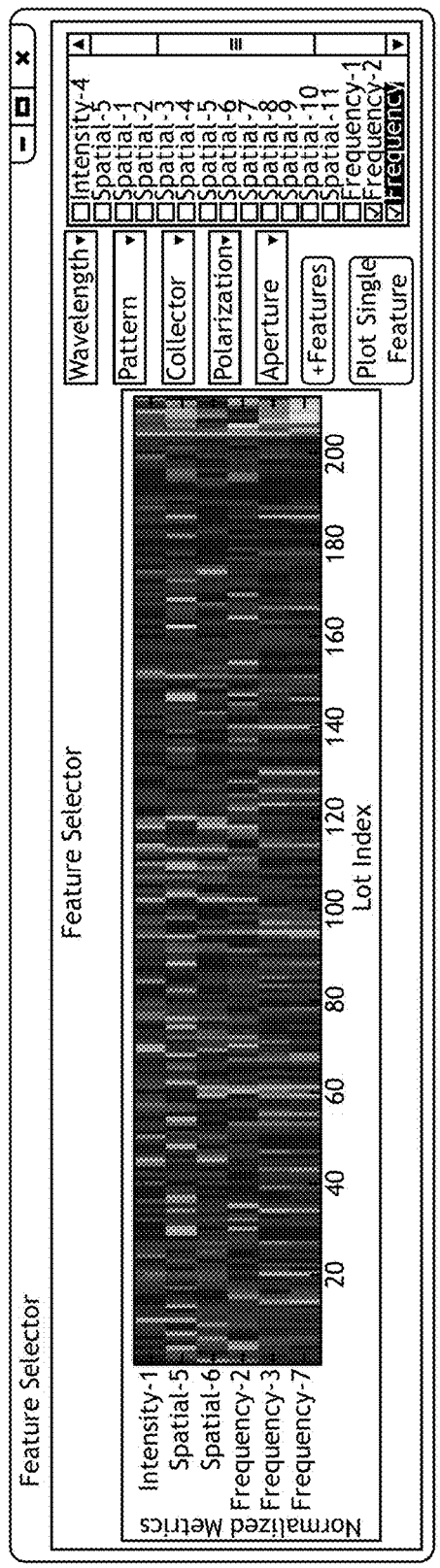
FIG. 5 is an illustration depicting an exemplary report displaying multiple reporting features.
Figure 6:
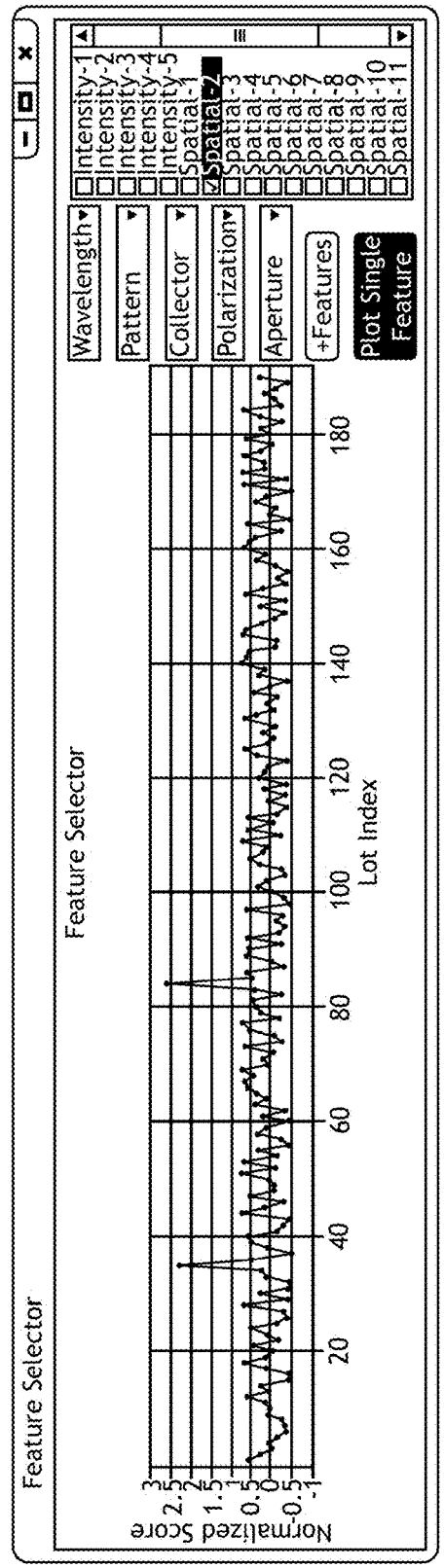
FIG. 6 is an illustration depicting an exemplary report displaying a single reporting feature.

The results of the classification, whether supervised or unsupervised, should be reported to the user in textual and/or graphical representations. It is contemplated that both wafer- and lot-level metrics/data can be visualized in a variety of manners. Referring to FIGS. 5 and 6, exemplary reports identifying potential outliers are shown. The x-axis of these exemplary reports may identify the indices of the various wafer lots being analyzed, and the y-axis of these exemplary reports may identify the type of measurement metrics currently being displayed. As previously described, since each type of measurement metrics is processed independently, a list of such metrics can be provided for the user to choose from for reporting purposes. It is contemplated that the report may display multiple features (e.g., multiple types of metrics) simultaneously as shown in FIG. 4, or a single feature as shown in FIG. 5, based on user preference and selection. It is understood that these exemplary reports are depicted merely for illustrative purposes; other types of reports and reporting formats can be utilized without departing from the spirit and scope of the present disclosure.

Figure 7:
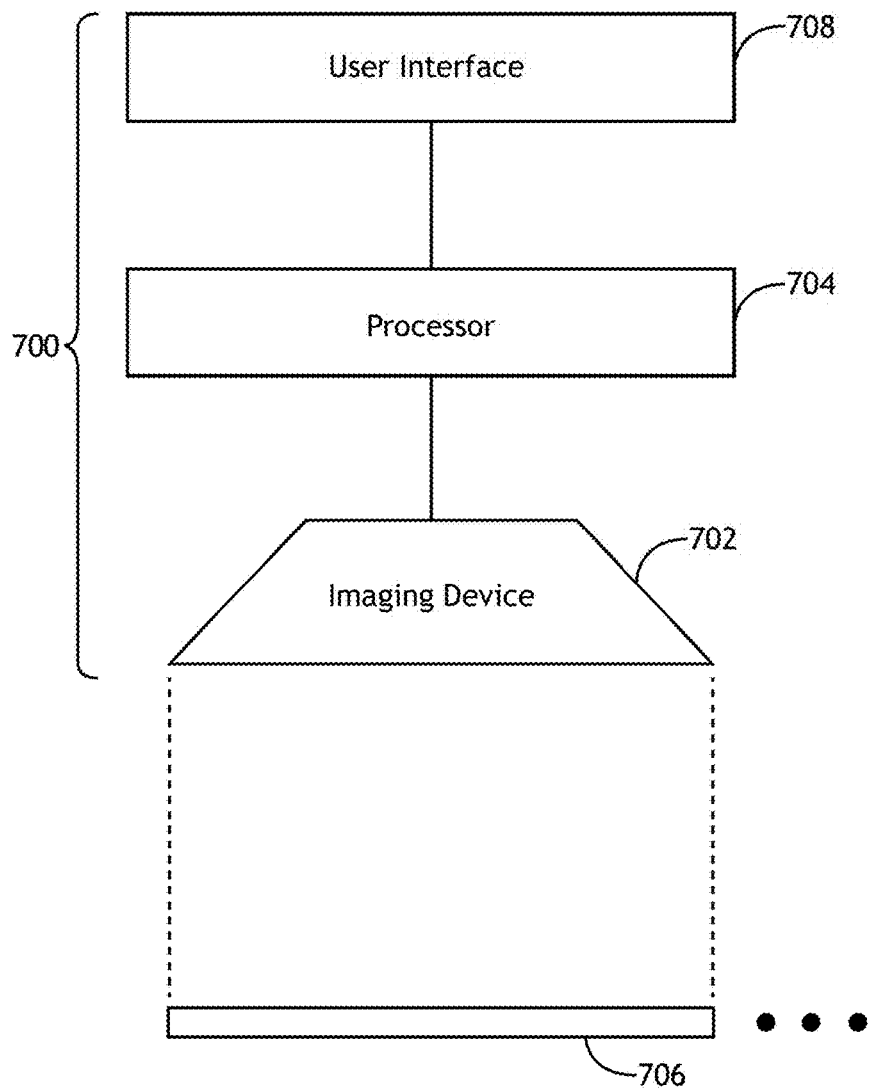
FIG. 7 is a block diagram depicting a process tool condition monitoring system.

Referring now to FIG. 7, a block diagram depicting a process tool condition monitoring system 700 is shown. The system 700 may include imaging devices (e.g., a scanner, a camera, a microscope or the like) 702 configured for obtaining images of semiconductor devices 706 (e.g., wafers or wafer lots). For instance, the imaging device 702 may capture an aerial image (e.g., top views) of the semiconductor devices 706 and provide the image to a processor 704 configured for processing the obtained image. It is contemplated that the system 700 may include more than one imaging device without departing from the spirit and scope of the present disclosure. Certain systems may provide the ability to capture all surfaces (front side, back side and edge) of the semiconductor device simultaneously.

The processor 704 may be implemented utilizing any standalone or embedded computing device (e.g., a computer, a processing unit/circuitry or the like). Upon receiving the images from the imaging device 702, the processor 704 may perform the classification processes described above. The classification report may then be provided to a user via a user interface 708, which may also receive input from the user as a part of the training process previously described.

It is contemplated that the calculated statistical data and the trained classification engine may be recorded (e.g., stored in a database) for future references. The stored data may be re-used and/or refined over time, or may be duplicated and loaded into another process tool condition monitoring system. Furthermore, it is contemplated that the stored data may be shared across multiple monitoring systems, and these systems may be operated in a distributed manner, which may be appreciated in various fabrication environments.

It is noted that the system and method for monitoring process tool conditions in accordance with the present disclosure is capable of determining process tool drifts without detecting specific wafer defects. Only broad wafer-based and lot-based metrics need to be computed, and a classification engine is able to identify potential outliers that may indicate process tool drifts and provide early warning. Such a detection process is invaluable to the semiconductor manufacturing industry as it reduces wafer and material loss. Furthermore, it is noted that since high resolution images are not required, the reduced demand on the optical system is beneficial as it enables increased wafer sampling and in turn increases throughput.

As described above, the system and method for monitoring process tool conditions in accordance with the present disclosure provides several advantages. Such advantages include: enabling trending of process tool behavior to take preventive actions before expensive issues affecting multiple lots develop; providing high throughput processing thanks to low optical demand and adjustable levels of down-sampling operations; allowing for different levels of user engagement with corresponding levels of performance; providing the ability to maintain historical records of fabrication-wide manufacturing processes; and supporting customization to specific challenges with a short turnaround time.

It is contemplated that in addition to providing the ability to identify potential process tool drifts, the system and method for monitoring process tool conditions in accordance with the present disclosure may also provide the ability to highlight wafers with sub-resolution anomalous process signatures. In other words, the system and method in accordance with the present disclosure has the ability to find problems of interest to the user that conventional defect detection approaches would not be able to find due to the defect size being under their optical resolutions, such as circle scratches, subtle overpolish and underpolish, stepper defocus or the like. In addition, the system and method in accordance with the present disclosure can also provide process window monitoring, which refers to fine-tuning process tool conditions. It is noted that since an inherent aspect of this application is training to a baseline for what a good/normal process looks like, the user can then identify what process optimizations produce results that would significantly deviate from such baseline, as opposed to those that would produce wafers with similar outcome. It is contemplated that the system and method in accordance with the present disclosure may be utilized for various other purposes without departing from the spirit and scope of the present disclosure.

It is also contemplated that while the examples above referred to wafer measurements, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is to be understood that the present disclosure may be implemented in forms of a software/firmware package. Such a package may be a computer program product which employs a computer-readable storage medium/device including stored computer code which is used to program a computer to perform the disclosed function and process of the present disclosure. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A method for monitoring a process tool condition, the method comprising:

obtaining a plurality of wafer images from a plurality of wafers, the plurality of wafers including wafers fabricated in a plurality of wafer lots;

reducing resolution of one or more images from the plurality of wafer images, wherein a user tunes the reduced resolution of the one or more images from the plurality of wafer images;

calculating one or more wafer-level metrics for the plurality of wafers based on images having a reduced resolution;

extracting one or more process tool signatures from the one or more wafer-level metrics, wherein the one or more wafer-level metrics are configured for extraction of variations across the plurality of wafers and are not associated with one or more specific defects of the plurality of wafers;

calculating one or more lot-level statistical values for the plurality of wafer lots, the one or more lot-level statistical values being calculated at least partially based on one or more wafer-level metrics for wafers fabricated in the plurality of wafer lots in a specified process group; and identifying a process tool drift condition based on the one or more lot-level statistical values, wherein the one or more lot-level statistical values are based on variation among the plurality of wafer images not associated with specific defects.

2. The method of claim 1, wherein the one or more wafer-level metrics include at least one of a pixel intensity based metric, a spatial based metric, or a frequency space based metric.

3. The method of claim 1, wherein the specified process group is a user-specified process group.

4. The method of claim 3, wherein a lot-level statistical value is calculated for each particular wafer lot of the plurality of wafer lots, and where the calculation of the lot-level statistical value includes normalizing the wafer-level metrics for wafers fabricated in the particular wafer lot.

5. The method of claim 4, wherein the lot-level statistical value for each particular wafer lot is calculated based on:

$$\text{NormRglot} = <xi - \mu PG \sigma PG > \{iLot\}$$

wherein xi denotes the wafer-level metrics for an $i^{th}$ wafer in the particular wafer lot, µPG denotes a calculated mean, and σPG denotes a calculated standard deviation.

6. The method of claim 1, further comprising at least one of:
identifying a wafer with a sub-resolution anomalous process signature; and
providing process window monitoring for fine-tuning the process tool condition.

7. A process tool condition monitoring system, comprising:
an imager, the imager configured to obtain a plurality of wafer images from a plurality of wafers, the plurality of wafers including wafers fabricated in a plurality of wafer lots; and
a processor communicatively coupled to the imager, the processor configured to:
reduce resolution of one or more images from the plurality of wafer images, wherein the processor is further configured to receive input from a user to tune the reduced resolution of the one or more images from the plurality of wafer images;
calculate one or more wafer-level metrics for the plurality of wafers based on images having a reduced resolution;
extract one or more process tool signatures from the one or more wafer-level metrics, wherein the one or more wafer-level metrics are configured for extraction of variations across the plurality of wafers and are not associated with one or more specific defects of the plurality of wafers;
calculate one or more lot-level statistical values for the plurality of wafer lots, the one or more lot-level statistical values being calculated at least partially based on one or more wafer-level metrics for wafers fabricated in the plurality of wafer lots in a specified process group; and
identify a potential process tool drift condition based on the one or more lot-level statistical values, wherein the one or more lot-level statistical values are based on variation among the plurality of wafer images not associated with specific defects.

8. The system of claim 7, wherein the wafer images obtained are full wafer images.

9. The system of claim 7, wherein the one or more wafer-level metrics include at least one of a pixel intensity based metric, a spatial based metric, or a frequency space based metric.

10. The system of claim 7, wherein the specified process group is a user-specified process group.

11. The system of claim 10, wherein a lot-level statistical value is calculated for each particular wafer lot of the plurality of wafer lots, and where the calculation of the one or more lot-level statistical value includes normalizing the one or more wafer-level metrics for wafers fabricated in the particular wafer lot.

12. The system of claim 11, wherein the lot-level statistical value for each particular wafer lot is calculated based on:

$$\text{NormRglot} = <xi - \mu PG \sigma PG > \{iLot\}$$

wherein xi denotes the wafer-level metrics for an $i^{th}$ wafer in the particular wafer lot, µPG denotes a calculated mean, and σPG denotes a calculated standard deviation.

13. The system of claim 7, further comprising:
a user interface, the user interface configured to receive a user adjustment regarding the identified potential process tool drift condition.

14. The system of claim 13, wherein the processor is further configured to adjust a process utilized to identify the potential process tool drift condition based on the user adjustment.

15. A method for monitoring a process tool condition, the method comprising:
obtaining a plurality of full wafer images from a plurality of wafers, the plurality of wafers including wafers fabricated in a plurality of wafer lots;
reducing resolution of one or more images from the plurality of wafer images, wherein a user tunes the reduced resolution of the one or more images from the plurality of wafer images;
calculating one or more wafer-level metrics for the plurality of wafers based on images having a reduced resolution;
extracting one or more process tool signatures from the one or more wafer-level metrics, wherein the one or more wafer-level metrics are configured for extraction of variations across the plurality of wafers and are not associated with one or more specific defects of the plurality of wafers;
calculating one or more lot-level statistical values for the plurality of wafer lots, the one or more lot-level statistical values being calculated at least partially based on the one or more wafer-level metrics for wafers fabricated in the plurality of wafer lots in a specified process group;
identifying a potential process tool drift condition based on the one or more lot-level statistical values, wherein the one or more lot-level statistical values are based on variation among the plurality of wafer images not associated with specific defects; and
receiving a user adjustment regarding the identified potential process tool drift condition.

16. The method of claim 15, wherein the one or more wafer-level metrics include at least one of a pixel intensity based metric, a spatial based metric, or a frequency space based metric.

17. The method of claim 15, wherein the specified process group is a user-specified process group.

18. The method of claim 17, wherein a lot-level statistical value is calculated for each particular wafer lot of the plurality of wafer lots, and where the calculation of the lot-level statistical value includes normalizing the wafer-level metrics for wafers fabricated in the particular wafer lot.

19. The method of claim 18, wherein the lot-level statistical value for each particular wafer lot is calculated based on:

$$\text{NormRglot} = <xi - \mu PG \sigma PG > \{iLot\}$$

wherein xi denotes the wafer-level metrics for an $i^{th}$ wafer in the particular wafer lot, µPG denotes a calculated mean, and σPG denotes a calculated standard deviation.

* * * * *